United States Patent
Gumm

(10) Patent No.: US 6,768,434 B1
(45) Date of Patent: Jul. 27, 2004

(54) HIGH SPEED X/SINE(X) CORRECTION CIRCUIT

(75) Inventor: Linley F. Gumm, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/440,342

(22) Filed: May 15, 2003

(51) Int. Cl.[7] .............................. H03M 1/00; H03F 1/26; G01R 19/00
(52) U.S. Cl. ....................... 341/110; 341/144; 375/296; 375/297; 330/2; 330/149; 370/307
(58) Field of Search ................................. 341/110, 144, 341/155; 375/296, 297; 330/2, 149

(56) References Cited

U.S. PATENT DOCUMENTS

| | | | |
|---|---|---|---|
| 5,208,596 A | | 5/1993 | Dieterich |
| 5,583,501 A | * | 12/1996 | Henrion et al. ............. 341/143 |
| 6,211,733 B1 | * | 4/2001 | Gentzler ..................... 330/149 |
| 6,298,096 B1 | * | 10/2001 | Burgin ....................... 330/149 |
| 6,298,097 B1 | * | 10/2001 | Shalom ...................... 375/296 |
| 6,304,140 B1 | * | 10/2001 | Thron et al. ................ 330/149 |
| 6,317,167 B1 | | 11/2001 | McNeely |
| 6,449,262 B1 | * | 9/2002 | Hwang et al. .............. 370/307 |
| 6,587,514 B1 | * | 7/2003 | Wright et al. ............... 375/296 |
| 6,677,870 B2 | * | 1/2004 | Im et al. ..................... 341/110 |

OTHER PUBLICATIONS

Ron Bracewell, "The Fourier Transform and Its Applications" 1965, McGraw–Hill Book Company.
M. Engelson and A. Frisch, "Impulse Generator Techniques" Pentronix Associates, Inc., Brooklyn, N.Y., pp. 183–188b, 1962.

* cited by examiner

*Primary Examiner*—Michael Tokar
*Assistant Examiner*—Lam T. Mai
(74) *Attorney, Agent, or Firm*—Francis I. Gray

(57) ABSTRACT

A high speed x/sine(x) correction circuit for a digital to analog converter (DAC) functions by implementing a filter with an impulse response that approximates a sine(x)/x response. Each digital data value of an input signal to be converted by the DAC is considered a separate impulse. Each impulse, or initial pulse, is used to create a first reflection pulse by delaying the initial pulse by one clock cycle, inverting the delayed initial pulse and multiplying the delayed initial pulse by a constant less than one, such as dividing the delayed initial pulse by right-shifting the digital data value of the delayed initial pulse. The first reflection pulse is added to the input signal in the clock cycle it is generated prior to input to the DAC. A second reflection pulse may be generated in like manner from the first reflection pulse with an additional clock cycle delay for optimum results, both reflection pulses being added to the input signal in the clock cycle they are generated prior to input to the DAC.

17 Claims, 1 Drawing Sheet

HIGH SPEED X/SINE(X) CORRECTION CIRCUIT

BACKGROUND OF THE INVENTION

The present invention relates to compensation of deleterious frequency characteristics, and more particularly to a high speed x/sine(x) correction circuit for a digital analog converter.

Waveform generators that include a digital to analog converter (DAC) input a discrete sequence of digital sample values to the DAC which in turn outputs corresponding analog values. The analog value corresponding to a single input digital value is maintained for the interval between input sample values. This causes the DAC to exhibit an inherent, undesirable, sine(x)/x frequency response.

This effect is demonstrated mathematically by assuming that the desired function a(t) is to be passed through the DAC in discrete form by the DAC's output assuming the instantaneous value of A(t) every T seconds and holding that value over the interval. Using the notation used by Dr. Ron Bracewell in his book, "The Fourier Transform and Its Applications" (McGraw-Hill, Inc. (c) 1965), the DAC's output as a function of time is:

$$v(t)=a(t)\cdot\uparrow\uparrow\uparrow(t/T)*\Pi(t/T)$$

where $\uparrow\uparrow\uparrow(t/T)$ is a sequence of impulse functions with a period of T seconds and $\Pi(t/T)$ is a unit amplitude pulse T seconds wide.

The Fourier transform of this function is:

$$V(f)=A(f)*\uparrow\uparrow\uparrow(Tf)\cdot T[\text{sine}(\pi Tf)/(\pi Tf)]$$

where T is the period of the DAC's clock. It may be replaced in this equation by a clock frequency $F_c$:

$$V(f)=A(f)*\uparrow\uparrow\uparrow(f/F_c)\cdot T[\text{sine}(\pi f/F_c)/(\pi f/F_c)]$$

The convolution of a function [A(f)] with an impulse $[\uparrow\uparrow\uparrow(f/F_c)]$ is that function offset to the position of the impulse. Thus the DAC's output spectrum is the spectrum of the input signal repeated at intervals throughout the spectrum, each centered at a harmonic of the DAC's clock frequency. That complex spectrum is then shaped by the undesired sine(x)/x function where $x=\pi f/F_c$.

In typical applications the sine(x)/x frequency characteristic of the DAC is compensated by modifying the discrete data before it is applied to the DAC. This may take the form of a fixed coefficient pre-filter with an x/sine(x) frequency response. Since the x/sine(x) function approaches infinity for integer values of x, this function operates over only part of the DAC's output frequency range.

U.S. Pat. No. 5,208,569 teaches solving this problem by modifying the characteristics of a filter already present in the pre-DAC path to accomplish another filtering function. The characteristics of that filter are modified to be the desired function times—on a frequency by frequency basis—the x/sine(x) response. This approach reprograms pre-existing filtering to accomplish this process.

U.S. Pat. No. 6,317,167 teaches a solution to this problem for a specialized case where it is desired to use the output signal spectrum present at frequencies near the harmonics of the DAC's clock frequency as well as the spectrum from zero to one-half the clock frequency. This system makes use of a very complex filter, using complex—in the mathematical sense—arithmetic to accomplish an x/sine(x) correction over a limited frequency range at a number of frequency bands. The bands may be centered from near zero to a high harmonic of the clock frequency. This system is very complicated and as such is limited in how fast it can be made to operate with a given circuit technology.

What is desired is a simple x/sin(x) correction circuit constructed from simple digital circuit functions that operates near or at the limit in speed of any given technology used to implement it.

BRIEF SUMMARY OF THE INVENTION

Accordingly the present invention provides a high speed x/sine(x) correction circuit that creates a filter having an impulse response that approximates a sine(x)/x response. For each data value (each of which is considered an "impulse") of an input signal a scaled value of that impulse is generated and added in the following clock intervals prior to applying the input signal to a digital to analog converter (DAC) for conversion to an analog waveform. The scaled value may be thought of as a reflection pulse. A first reflection pulse may be generated by delaying the initial pulse one clock cycle, inverting the delayed initial pulse and multiplying the inverted initial pulse by a constant less than one. Preferably the value of the constant is 0.125 (⅛), which is obtained by right shifting the data three bits. A second reflection pulse may be derived in the same manner from the first reflection pulse after an additional clock cycle delay to provide optimum results. The reflection pulse(s) are added to the input signal in the clock cycle they are generated before input to the DAC.

The objects, advantages and other novel features of the present invention are apparent from the following detailed description when read in conjunction with the appended claims and attached drawing.

DETAILED DESCRIPTION OF THE INVENTION

Morris Engelson published a paper on the use of controlled reflections to correct the flatness of impulse generators. See "Impulse Generator Techniques" presented at the 8$^{th}$ Tri-Service Conference on Electromagnetic Compatibility in 1962. In a nutshell the output spectrum of a rectangular pulse is made much flatter if the pulse is immediately followed by a sequence of pulses of the same width, each with an amplitude p times the preceding pulse. The optimum value of ρ is about −0.11.

Figure 1:
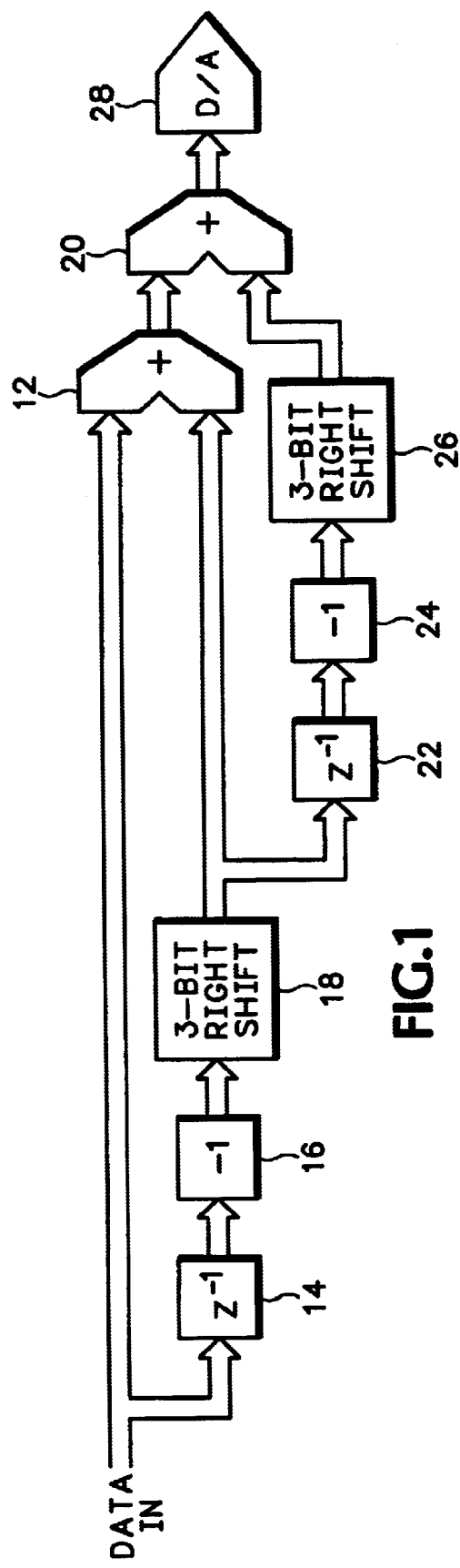
FIG. 1 is a digital logic diagram view of a high speed x/sine(x) correction circuit according to the present invention.
Figure 3:
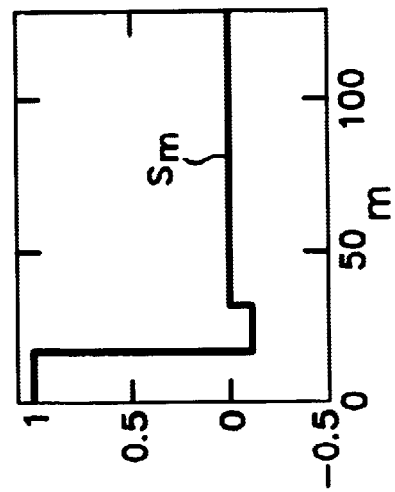
FIG. 3 is a graphical view of a corrected pulse for input to a DAC according to the present invention.

Referring now to FIG. 1 this principle is used to design a high speed x/sine(x) correction subsystem for a high speed arbitrary waveform generator. An initial pulse of digital data from an input signal, where each digital data value is treated as an impulse, is input to a first summation circuit 12 and to a one clock cycle delay circuit 14. The delayed pulse from the delay circuit 14 is input to an inverter 16, and the inverted pulse then is input to a shift register 18 that shifts the inverted pulse three bits to the right, i.e., multiplies the inverted pulse by 0.125, to produce a first reflection pulse. The first reflection pulse is input to the first summation circuit 12 for adding to the input signal in the clock cycle it is generated. The same process is applied using a second summation circuit 20 having as one input the output from the first summation circuit 12 and as the other input a second reflection pulse derived from the first reflection pulse via a cascade of another one clock cycle delay 22, inverter 24 and three-bit right shift register 26, such data being equivalent to the initial pulse being multiplied by $0.125^2 \cong 0.0156$. The output, which is shown in FIG. 3, from the second summation circuit 20 is then applied to a digital to analog converter (DAC) 28 to provide an analog waveform signal. The clock used for the one clock cycle delays 14, 22 is the DAC clock.

Figure 2:
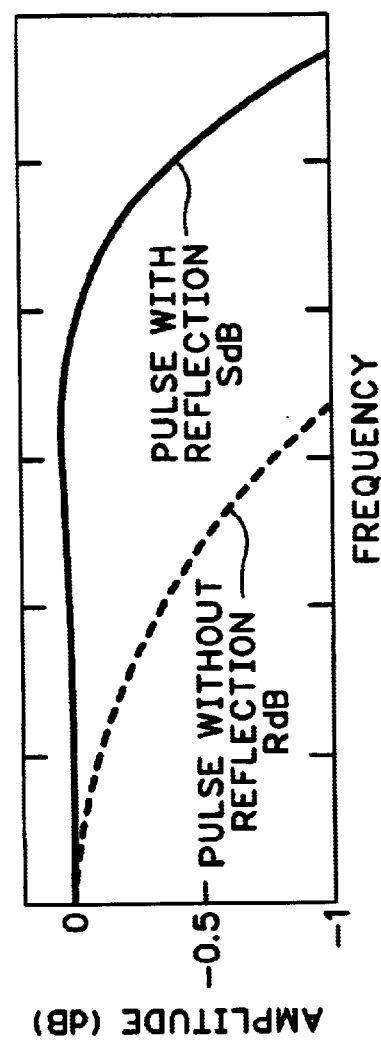
FIG. 2 is a graphical view showing the results of the high speed x/sine(x) correction circuit according to the present invention.

An example of the results is shown in FIG. 2. A data record of 1024 bits is used. The initial pulse, equivalent to one data point for the DAC 28, is 16 samples long with a normalized value of 1.0. A second pulse 16 samples long with a value of −0.125 immediately follows the initial pulse in the next clock cycle. A third pulse, also 16 samples long with a value 0.0156, follows the first two pulses in the following clock cycle. The dotted line shown in FIG. 2 is a spectrum for the initial pulse alone. The solid line is a spectrum for the three-pulse combination., There is a slight (0.036 dB) peaking and the 0.5 dB bandwidth is extended by about forty percent (40%). The 0.5 dB bandwidth is about 30% of the reciprocal of the pulse width. The response is down 1.76 dB at 50% of the reciprocal of the pulse width. If only one stage of delayed pulse is added to the initial pulse, the peaking is greater (0.31 dB) but the response at 50% of the reciprocal of the pulse width is down only 1.73 dB.

The technique described above creates an approximation to a sine(x)/x response after the initial impulse at t=0. The same approach may be used to create a symmetric approximation to sine(x)/x by delaying the initial impulse two clock cycles and adding two pre-reflections. However this approach increases the signal's latency by two clock periods and results in a nearly identical amplitude versus frequency response characteristic.

Thus the present invention provides a high speed x/sine(x) correction circuit by using controlled reflection pulses of an initial pulse from an input digital signal, the initial pulse representing one digital data value from the input signal, which are added to the input signal in the clock cycle they are generated prior to conversion to an analog waveform.

What is claimed is:

1. A high speed x/sine(x) correction circuit for a digital to analog converter comprising:
   means for generating a reflection pulse from an initial pulse, each digital data value from a digital data stream being the initial pulse; and
   means for combining the reflection pulse with the digital data stream prior to input to the digital to analog converter.

2. The circuit as recited in claim 1 wherein the generating means comprises:
   means for generating a first reflection pulse from the initial pulse; and
   means for generating a second reflection pulse from the first reflection pulse wherein the reflection pulse is a combination of the first and second reflection pulses.

3. The circuit as recited in claim 1 wherein the generating means comprises:
   means for delaying the initial pulse to produce a delayed initial pulse;
   means for inverting the delayed initial pulse to provide an inverted initial pulse; and
   means for attenuating the inverted initial pulse to produce the reflection pulse.

4. The circuit as recited in claim 2 wherein the first reflection pulse generating means comprises:
   first means for delaying the initial pulse to produce a delayed initial pulse;
   first means for inverting the delayed initial pulse to provide an inverted initial pulse; and
   first means for attenuating the inverted initial pulse to produce the first reflection pulse.

5. The circuit as recited in claim 4 wherein the second reflection pulse generating means comprises:
   second means for delaying the first reflection pulse to produce a delayed first reflection pulse;
   second means for inverting the delayed first reflection pulse to provide an inverted first reflection pulse; and
   second means for attenuating the inverted first reflection pulse to produce the second reflection pulse.

6. The circuit as recited in any of claims 3–5 wherein the delaying means comprises a delay circuit for delaying an input by a clock pulse at an output.

7. The circuit as recited in claim 6 wherein the clock pulse comprises a cycle of a sampling clock for the digital to analog converter.

8. The circuit as recited in claim 6 wherein the attenuating means comprises a shift register for shifting a digital data value at an input to the right by a specified number of bits at an output.

9. The circuit as recited in claim 8 wherein the specified number of bits comprises three bits.

10. A method of high speed x/sine(x) correcting a digital data stream prior to input to a digital to analog converter comprising the steps of:
    generating a reflection pulse from an initial pulse, each digital data value of the digital data stream being the initial pulse; and
    combining the reflection pulse with the digital data stream prior to input to the digital to analog converter.

11. The method as recited in claim 10 wherein the generating step comprises the steps of:
    delaying the initial pulse to produce a delayed initial pulse;
    inverting the delayed initial pulse to produce an inverted initial pulse; and
    attenuating the inverted initial pulse to produce a first reflection pulse as the reflection pulse.

12. The method as recited in claim 11 wherein the generating step further comprises the step of generating a second reflection pulse from the first reflection pulse, the combination of the first reflection pulse and second reflection pulse being the reflection pulse.

13. The method as recited in claim 11 wherein the second reflection pulse generating step comprises the steps of:
    delaying the reflection pulse to provide a delayed reflection pulse;
    inverting the reflection pulse to provide a negative reflection pulse; and
    attenuating the negative reflection pulse to produce the second reflection pulse.

14. The method as recited in any of claims 11–13 wherein the delaying step comprises the step of delaying an input by one clock cycle at an input.

15. The method as recited in claim 14 wherein the one clock cycle comprises a clock cycle of a sample clock for the digital to analog converter.

16. The method as recited in claim 14 wherein the attenuating step comprises the step of shifting an input digital value to the right by a specified number of bits at an output.

17. The method as recited in claim. 16 wherein the specified number of bits comprises three bits.

* * * * *